United States Patent
Ogura et al.

(10) Patent No.: US 7,408,210 B2
(45) Date of Patent: Aug. 5, 2008

(54) SOLID STATE IMAGE PICKUP DEVICE AND CAMERA

(75) Inventors: Masanori Ogura, Atsugi (JP); Toru Koizumi, Yokohama (JP); Akira Okita, Yamato (JP); Tetsuya Itano, Zama (JP); Shin Kikuchi, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 161 days.

(21) Appl. No.: 11/370,049

(22) Filed: Mar. 8, 2006

(65) Prior Publication Data

US 2006/0221667 A1 Oct. 5, 2006

(30) Foreign Application Priority Data

Mar. 18, 2005 (JP) ............... 2005-080081

(51) Int. Cl.
*H01L 31/58* (2006.01)
(52) U.S. Cl. .............. 257/233; 257/292; 257/431; 257/466; 257/E27.062; 257/E27.108; 257/462
(58) Field of Classification Search .......... 257/233, 257/292, 431–466, E27.062, E27.108
See application file for complete search history.

(56) References Cited

U.S. PATENT DOCUMENTS

| | | | | |
|---|---|---|---|---|
| 5,121,225 A | 6/1992 | Murata et al. | ............. | 358/471 |
| 5,245,203 A | 9/1993 | Morishita et al. | ............. | 257/113 |
| 5,261,013 A | 11/1993 | Murata et al. | ............. | 382/65 |
| 5,352,920 A | 10/1994 | Morishita et al. | ............. | 257/435 |
| 5,475,211 A | 12/1995 | Ogura et al. | ............. | 250/208.1 |
| 5,698,892 A | 12/1997 | Koizumi et al. | ............. | 257/620 |
| 6,188,094 B1 | 2/2001 | Kochi et al. | ............. | 257/232 |
| 6,605,850 B1 | 8/2003 | Kochi et al. | ............. | 257/431 |
| 6,670,990 B1 | 12/2003 | Kochi et al. | ............. | 348/310 |
| 6,949,637 B2 | 9/2005 | Lilly et al. | ............. | 250/208.1 |
| 6,960,751 B2 | 11/2005 | Hiyama et al. | ............. | 250/208.1 |
| 7,016,089 B2 | 3/2006 | Yoneda et al. | ............. | 358/482 |
| 7,110,030 B1 | 9/2006 | Kochi et al. | ............. | 348/308 |
| 7,126,102 B2 | 10/2006 | Inoue et al. | ............. | 250/214 |
| 7,187,052 B2 | 3/2007 | Okita et al. | ............. | 257/444 |
| 2003/0164887 A1 | 9/2003 | Koizumi et al. | ............. | 348/308 |

(Continued)

OTHER PUBLICATIONS

Sugawa, S. et al., "A 100dB Dynamic Range CMOS Image Sensor Using a Lateral Overflow Integration Capacitor", 2005 IEE International Solid-State Circuits Conference, pp. 352, 353 and 603 (Feb. 8, 2005).

*Primary Examiner*—Wai-Sing Louie
*Assistant Examiner*—Marc Armand
(74) *Attorney, Agent, or Firm*—Fitzpatrick, Cella, Harper & Scinto

(57) ABSTRACT

An object of the present invention is to simultaneously realize the enlargement of a dynamic range and the downsizing of a pixel. An additional capacitor CS is composed by using: a first capacitor formed of a first diffusion layer, a second diffusion layer and a P well by layering the P well, the first diffusion layer, a first dielectric film, a first polysilicon layer, a second dielectric film and a second polysilicon layer; a second capacitor formed of the second diffusion layer, the first polysilicon layer and the first dielectric film; and a third capacitor formed of the first polysilicon layers, a second polysilicon layer, and a second dielectric film. Thereby, the additional capacitor CS for accumulating carriers overflown from a photodiode PD can secure a required capacitance value while making its size as small as possible.

4 Claims, 10 Drawing Sheets

U.S. PATENT DOCUMENTS

| | | |
|---|---|---|
| 2004/0000681 A1* | 1/2004 | Shinohara et al. ............ 257/290 |
| 2004/0119864 A1 | 6/2004 | Kikuchi ....................... 348/308 |
| 2005/0122418 A1 | 6/2005 | Okita et al. .................. 348/340 |
| 2005/0168618 A1 | 8/2005 | Okita et al. .................. 348/335 |
| 2005/0174552 A1 | 8/2005 | Takada et al. .................. 355/53 |
| 2005/0179796 A1 | 8/2005 | Okita et al. .................. 348/308 |
| 2005/0185074 A1 | 8/2005 | Yoneda et al. ............... 348/294 |
| 2005/0268960 A1 | 12/2005 | Hiyama et al. ............... 136/244 |
| 2005/0269604 A1 | 12/2005 | Koizumi et al. ............. 257/291 |
| 2006/0027843 A1 | 2/2006 | Ogura et al. ................. 257/291 |
| 2006/0043261 A1 | 3/2006 | Matsuda et al. ........... 250/208.1 |
| 2006/0043393 A1 | 3/2006 | Okita et al. .................... 257/93 |
| 2006/0043439 A1 | 3/2006 | Koiaumi ..................... 257/291 |
| 2006/0043440 A1 | 3/2006 | Hiyama et al. ............... 257/291 |
| 2006/0044434 A1 | 3/2006 | Okita et al. .................. 348/294 |
| 2006/0044439 A1 | 3/2006 | Hiyama et al. ............... 348/308 |
| 2006/0119720 A1* | 6/2006 | Hong ......................... 348/308 |
| 2006/0157759 A1 | 7/2006 | Okita et al. .................. 257/292 |
| 2006/0158539 A1 | 7/2006 | Koizumi et al. ............. 348/300 |
| 2006/0158543 A1 | 7/2006 | Ueno et al. .................. 348/308 |
| 2006/0208161 A1 | 9/2006 | Okita et al. ............... 250/208.1 |
| 2006/0208291 A1 | 9/2006 | Koizumi et al. ............. 257/292 |
| 2006/0208292 A1 | 9/2006 | Itano et al. ................... 257/292 |
| 2007/0018080 A1 | 1/2007 | Inoue et al. .................. 250/214 |
| 2007/0085110 A1 | 4/2007 | Okita et al. .................. 257/239 |
| 2007/0126886 A1 | 6/2007 | Sakurani et al. ........... 348/222.1 |

* cited by examiner

SOLID STATE IMAGE PICKUP DEVICE AND CAMERA

BACKGROUND OF THE INVENTION

1. Field of the Invention

The present invention relates to a solid state image pickup device and to a camera, and particularly to those suitably used in a CMOS area sensor.

2. Related Background Art

In recent years, a CMOS area sensor having a photodiode and a MOS transistor integrated into one-chip has been used for a solid-state image sensing device. The CMOS area sensor has advantages of consuming a less electric power, needing a lower drive power and working in a higher speed than a CCD. Accordingly, the CMOS area sensor is expected to grow in demand in future.

For this reason, it has been proposed to enlarge a dynamic range of a solid-state image sensing device, by using such a CMOS area sensor.

The solid-state image sensing device includes a plurality of pixels having, for instance; a photodiode; a floating diffusion region (which may be abbreviated as FD, hereafter as needed); a first transfer transistor for transferring carriers from the above described photodiode to the above described floating diffusion region; an additional capacitor for accumulating the carriers overflown from the above described photodiode; a second transfer transistor for transferring the carriers from the above described additional capacitor to the above described floating diffusion region; and a reset transistor for resetting the above described floating diffusion region and the above described additional capacitor, to a predetermined potential. A certain solid state image pickup device has the CMOS area sensor having the pixels configured into a matrix shape (see a non-patent literature: Shigetoshi Sugawa, et al. "A 100 db Dynamic Range CMOS Image Sensor Using a lateral Overflow Integration Capacitor", ISSCC 2005/SESSION19/IMAGES/19.4, DIGEST OF TECHNICAL PAPERS, 2005 IEEE International Solid-State Circuit Conference, Feb. 8, 2005, P352-353, 603).

The non-patent literature describes a technology of accumulating carriers overflown from the above described photodiode by using the above described additional capacitor, and transferring the accumulated carriers to the above described floating diffusion region with the use of the above described second transfer transistor. Thereby, the technology can form a pixel signal through using the carriers accumulated in the above described additional capacitor and the carriers accumulated in the above described photodiode, and consequently can enlarge a dynamic range of a CMOS area sensor. In the technology, as the above described additional capacitor increases its capacitance value, it can accumulate more carriers, and can more enlarge the dynamic range of the CMOS area sensor.

However, in the above described conventional technology, the capacitance of the above described additional capacitor is not concretely considered. Therefore, the above described additional capacitor has a possibility of being upsized with the increase of the capacitance value of the above described additional capacitor. The above described additional capacitor is formed in a pixel, so that the upsizing of the above described additional capacitor may lead to the upsizing of the pixel.

The present invention is designed with respect to the above problems, and is directed at providing a solid state image pickup device which realizes the enlargement of a dynamic range and the minimization of a size of a pixel, and at providing a camera using the solid state image pickup device.

SUMMARY OF THE INVENTION

A solid state image pickup device according to the present invention includes a plurality of pixels having: a photoelectric conversion region for accumulating carriers generated by incident light; a first transfer switch for transferring the carriers accumulated in the above described photoelectric conversion region; a floating diffusion region for making the carriers accumulated in the photoelectric conversion region flow therein through the first transfer switch; a carrier accumulating region for accumulating at least a part of carriers overflown from the photoelectric conversion region; and a second transfer switch for transferring the carriers accumulated in the carrier accumulating region to the floating diffusion region; wherein the carrier accumulating region has a plurality of parts each of which forms a capacitor for accumulating the carriers overflown from the photoelectric conversion region therein, and the plurality of the parts are stacked.

Another feature of the present invention includes a plurality of pixels having: a photoelectric conversion region for accumulating carriers generated by incident light; a first transfer switch for transferring the carriers accumulated in the photoelectric conversion region; a floating diffusion region for making the carriers accumulated in the photoelectric conversion region flow therein through the first transfer switch; a carrier accumulating region for accumulating at least a part of carriers overflown from the photoelectric conversion region; and a second transfer switch for transferring the carriers accumulated in the carrier accumulating region to the floating diffusion region; wherein the carrier accumulating region has one part of a semiconductor substrate of a first conductivity type, a first dielectric film formed on one part of the semiconductor substrate, a first electrode layer formed on the first dielectric film, a second dielectric film formed on the first semiconductor film, and the second electrode layer formed on the second dielectric film.

A camera according to the present invention comprises a solid state image pickup device, a lens for focusing an optical image on the solid state image pickup device, and a diaphragm for varying a quantity of light having passed through the lens.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

A solid state image pickup device according to the present invention has capacitors for accumulating carriers overflown from a photoelectric conversion region to integrate the capacitances, and accordingly can realize a carrier accumulating region to secure the maximized capacitance value, while minimizing an area in a transverse direction. As a result of this, the solid state image pickup device can simultaneously realize the enlargement of a dynamic range and the downsizing of a pixel.

First Embodiment

In the next place, a first embodiment according to the present invention will be described with reference to the drawings.

Figure 1:
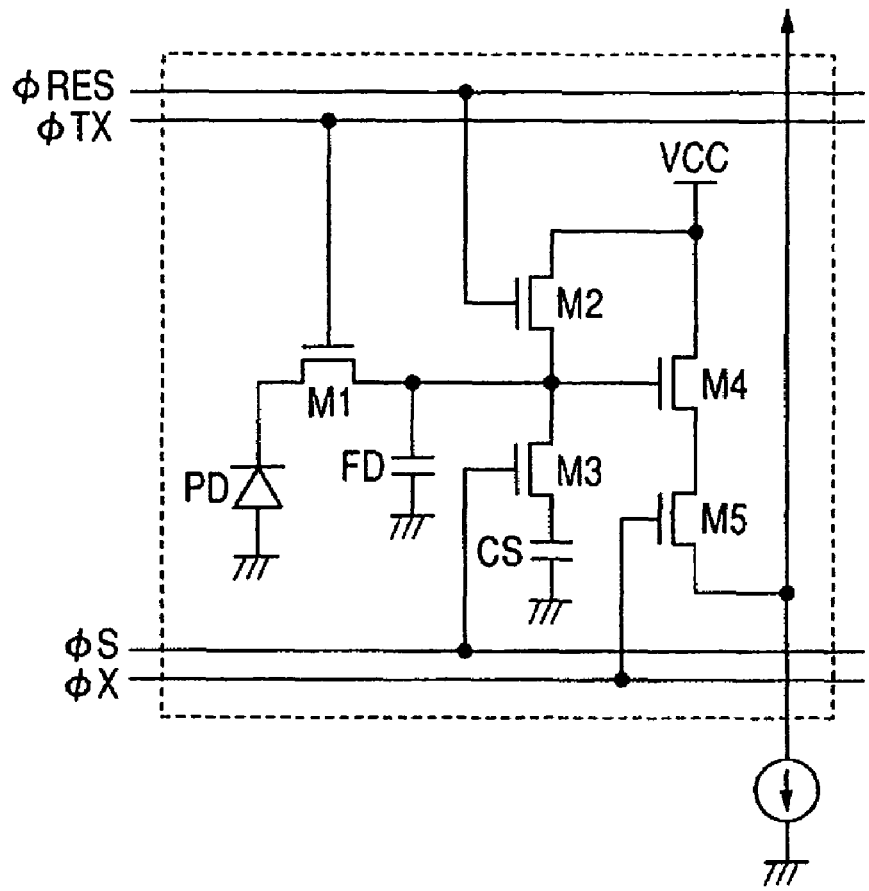
FIG. 1 is a view showing an example of a diagrammatic configuration of a pixel arranged in a solid state image pickup device, which is used in a first embodiment according to the present invention.

FIG. 1 is a view showing an example of a diagrammatic configuration of a pixel provided in a solid state image pickup device of the present embodiment.

In FIG. 1, the solid state image pickup device of the present embodiment contains the pixel having a photodiode PD, a first transfer MOS transistor M1, a reset MOS transistor M2, a second transfer MOS transistor M3, a source follower MOS transistor M4, and a selective MOS transistor M5; and has a plurality of the pixels configured into a two-dimensional matrix consisting of n lines and m rows (in which n and m are natural numbers).

A photodiode PD is connected to a floating diffusion region FD through a first transfer MOS transistor M1. A source or a drain region of a reset MOS transistor M2 is connected to the floating diffusion region FD. A gate of the source follower MOS transistor M4 is also connected to the floating diffusion region FD. Furthermore, a source or a drain region of a second transfer MOS transistor M3 is connected to the floating diffusion region FD. In addition, to the second transfer MOS transistor M3, an additional capacitor CS for accumulating carriers overflown from the photodiode PD is connected.

A source follower MOS transistor M4 is interconnected with a selective MOS transistor M5, and amplifies a signal based on carriers transferred to the floating diffusion region FD.

A first transfer MOS transistor M1, a reset MOS transistor M2, a second transfer MOS transistor M3 and a selective MOS transistor M5 are on-off controlled by a control signal (gate signal) each supplied to a gate. The first transfer MOS transistor M1, the reset MOS transistor M2, the second transfer MOS transistor M3 and the selective MOS transistor M5 are set to an ON state (conduction) when a high level of a gate signal is supplied to a gate, and to an OFF state (breaking) when a low-level of a gate signal is supplied to the gate.

Specifically, a control signal $\phi$TX is supplied to the gate of a first transfer MOS transistor M1, a control signal $\phi$S is supplied to a second transfer MOS transistor M3, a control signal $\phi$X is supplied to the gate of a selective MOS transistor M5, and a control signal $\phi$RES is supplied to the gate of a reset MOS transistor M2.

Here, a control signal $\phi$TX controls the transfer of carriers accumulated in a photodiode PD to a floating diffusion region FD. A control signal $\phi$S controls the transfer of carriers which have been overflown from the photodiode PD and accumulated in an additional capacitor CS, to a floating diffusion region FD. A control signal $\phi$X controls an operation for selecting a pixel. A control signal $\phi$RES controls the resetting of a potential of the floating diffusion region FD into a power supply potential $V_{cc}$ (for instance, +5V).

A solid state image pickup device of the present embodiment has a memory circuit arranged outside a pixel region having the pixel in FIG. 1 formed therein. The memory circuit has a signal-level-retaining capacitor for retaining a signal having the totalized level of a signal (S) transferred to a floating diffusion region FD and a reset level (N), and a reset-level-retaining capacitor for retaining a signal of the reset level (N).

The solid state image pickup device of the present embodiment also has a difference amplifier for amplifying a differential signal (the signal of a signal level (S)) which is a difference between a totalized signal of a signal level (S) retained in the above described signal-level-retaining capacitor $C_s$ and of a reset level (N) and the signal of the reset level (N) retained in the above described reset-level-retaining capacitor. The solid state image pickup device outputs a signal obtained from the difference amplifier.

Figure 2:
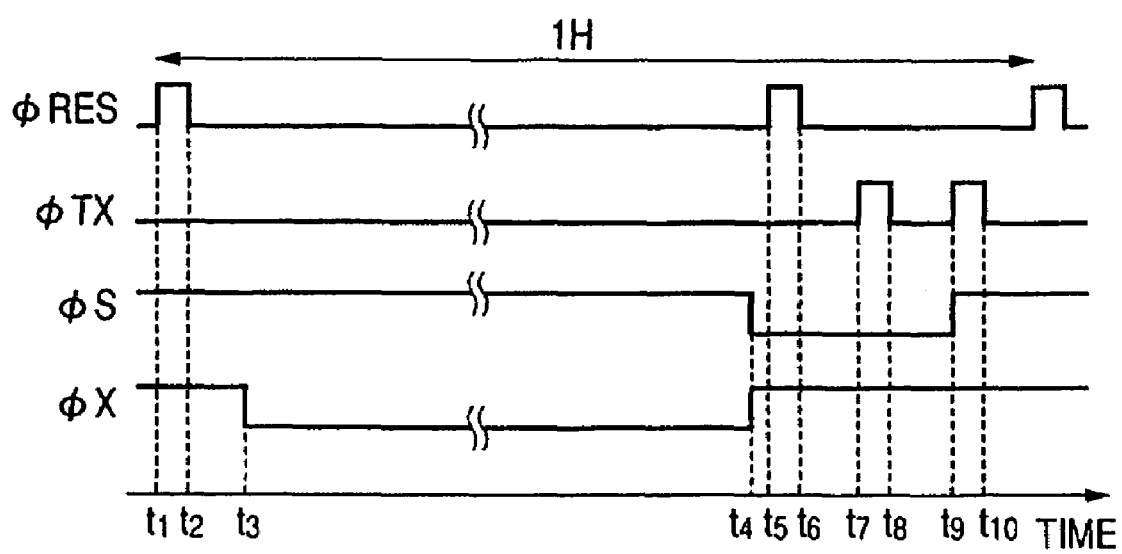
FIG. 2 is a timing chart for explaining an example of a reading-out operation of a pixel in a solid state image pickup device, which is used in a first embodiment according to the present invention.

Here, an example of an operation for reading out a pixel in a solid state image pickup device of the present embodiment will be described with reference to a timing chart in FIG. 2.

At first, at time t1, a high level of a control signal $\phi$S is supplied to a second transfer MOS transistor M3, and a high level of a control signal $\phi$X is supplied to a selective MOS transistor M5. In the state, a high level of a control signal $\phi$RES is supplied to the gate of a reset MOS transistor M2. Then, the reset MOS transistor M2, a second transfer MOS transistor M3 and a selective MOS transistor M5 are turned on. When the selective MOS transistor M5 is turned on, a floating diffusion region FD and an additional capacitor CS are reset to a source voltage $V_{cc}$, in a state that a pixel containing the selective MOS transistor M5 is selected.

At time t2, a low-level control signal $\phi$RES is supplied to a reset MOS transistor M2 to turn the reset MOS transistor M2 off, and a reset operation for a floating diffusion region FD and an additional capacitor CS is finished. When the reset operation is carried out, reset levels (N2) of a floating diffusion region FD and an additional capacitor CS are read out.

Figure 3:
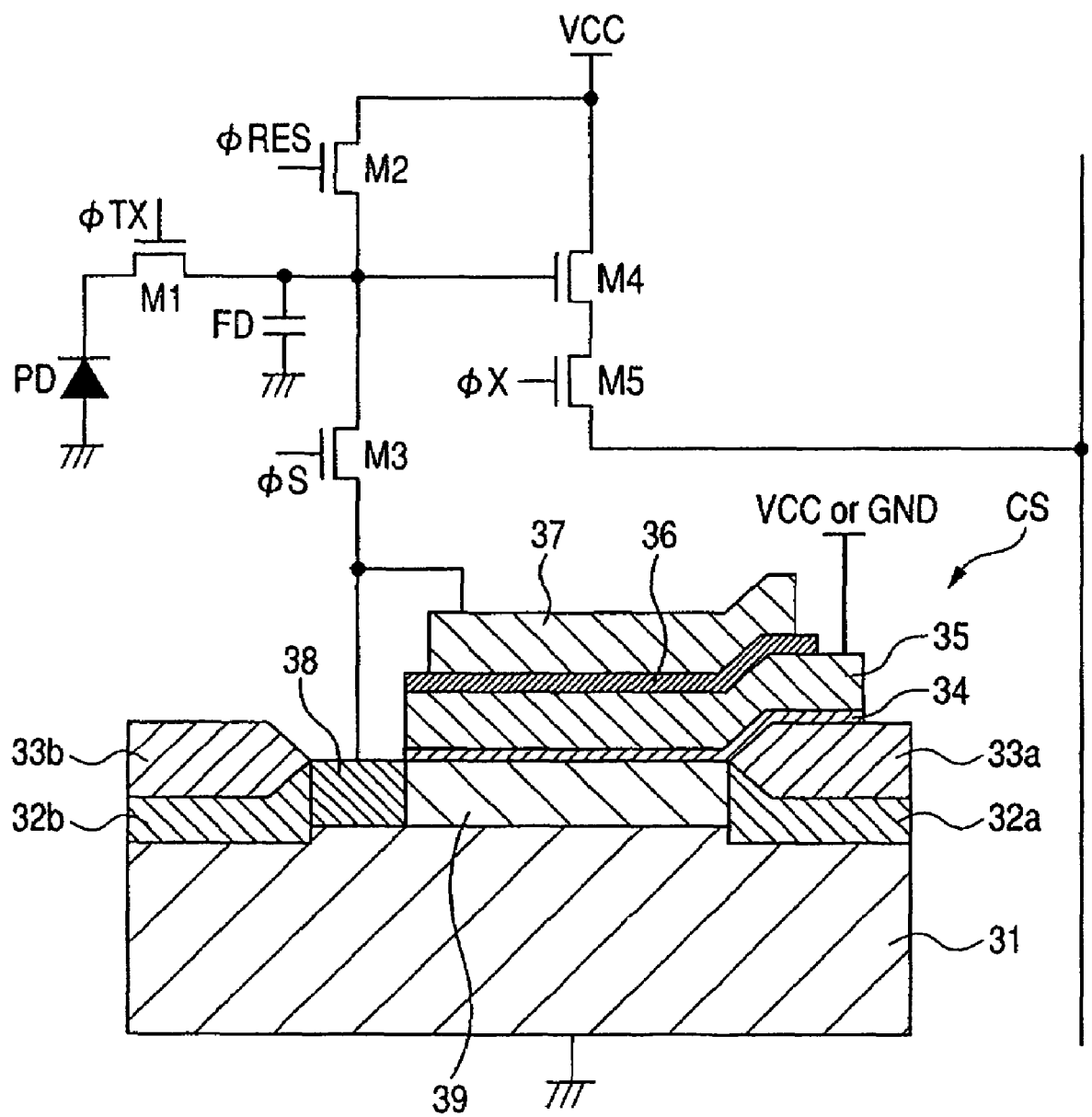
FIG. 3 is a sectional side view showing an example of the configuration of an additional capacitor, which is used in a first embodiment according to the present invention.

At time t3, a low-level control signal φX is supplied to a selective MOS transistor M5. As a result of this, the selective MOS transistor M5 is turned off; a shutter which is not shown in the drawings is opened; and carriers generated in a photodiode PD begin to be accumulated. At time t3 to t4, the carriers continue to be accumulated in the photodiode PD, and at the same time the carriers overflown from the photodiode PD are sent into an overflow drain region 38 and a region having an additional capacitor CS formed therein, which are shown in FIG. 3. The carriers sent into the overflow drain region 38 are accumulated in a floating diffusion FD. On the other hand, the carriers sent into the region having the additional capacitor CS formed therein are accumulated in the region (an additional capacitor CS).

At time t4, a high level of a control signal φX is supplied to a selective MOS transistor M5, and at the same time, a low-level control signal φS is supplied to a second transfer MOS transistor M3. Thereby, the selective MOS transistor M5 is turned on, the second transfer MOS transistor M3 is turned off, and an accumulation operation for carriers generated in a photodiode PD is finished.

At time t5, a control signal φRES is supplied to a reset MOS transistor M2. Thereby, the reset MOS transistor M2 is turned on to reset a floating diffusion region FD to a source voltage $V_{cc}$.

At time t6, a low-level control signal φRES is supplied to a reset MOS transistor M2 to turn the reset MOS transistor M2 off, and a reset operation for a floating diffusion region FD is finished. By this reset operation, a reset level (N1) in the floating diffusion region FD is read out.

At time t7, a high level of a control signal φTX is supplied to a first transfer MOS transistor M1. Thereby, the first transfer MOS transistor M1 is turned on, and carriers accumulated in a photodiode PD are transferred to the floating diffusion region FD. As the high level of a control signal φTX, the signal of 5 [V] is used in the present embodiment as described below.

At time t8, a low-level control signal φTX is supplied to a first transfer MOS transistor M1. Thereby, the first transfer MOS transistor M1 is turned off to finish a transfer operation for carriers accumulated in a photodiode PD. After the transfer operation has been finished, a reset level (N1) in a floating diffusion region FD and a signal level (S1) based on carriers accumulated in the floating diffusion region FD are read out as an added value. As the low-level control signal φTX, a signal of −1 [V] is used in the present embodiment as will be described below.

At time t9, a high level of a control signal φTX is supplied to a first transfer MOS transistor M1, and at the same time, a high level of a control signal φS is supplied to a second transfer MOS transistor M3. Thereby, the first and second transfer MOS transistors M1 and M3 are turned on. By the operation, a signal level (S1) based on carriers accumulated in a floating diffusion region FD, a signal level (S2) based on carriers accumulated in an additional capacitor CS, a reset level (N1) in the floating diffusion region FD, and a reset level (N2') which is approximately equal to an added amount of reset levels in the floating diffusion region FD and in the additional capacitor CS are read out.

Finally, at time t10, the low-level control signal φTX is supplied to the first transfer MOS transistor M1 to turn the first transfer MOS transistor M1 off and finish one cycle of the operation.

In the embodiment, a pixel which has the above described configuration and works as described above is provided with an additional capacitor CS configured as is described below.

In the next place, an additional capacitor CS of the present embodiment will be described with reference to FIG. 3.

FIG. 3 is a sectional side view showing an example for the configuration of the additional capacitor CS in the present embodiment; and also shows a connected state of the additional capacitor CS in the pixel shown in FIG. 1.

In FIG. 3, the additional capacitor CS has a p-type well (P well) 31, a channel stopper layer 32, a selective oxide film 33, a first dielectric film 34, a first polysilicon layer 35, a second dielectric film 36, a second polysilicon layer 37, a first diffusion layer 38a and a second diffusion layer 39.

First and second diffusion layers 38 and 39 can be formed by doping (impregnating) n-type impurities into the surface region of a P well 31.

Carriers overflown from a photodiode PD are accumulated in a region having capacitance between the first and second diffusion layers 38 and 39 which are n-type regions (regions containing the n-type impurities) and the P well 31 which is a p-type region (a region containing p-type impurities). Carriers accumulated in the region are transferred to a second transfer MOS transistor M3 through the first and second diffusion layers 38 and 39. Thus, the first and second diffusion layers 38 and 39 are the regions in which the carriers move, so that ohmic values in the first and second diffusion layers 38 and 39 are preferably minimized, by adjusting the concentration and thickness of the n-type impurities (by increasing the concentration and decreasing the thickness) in the first and second diffusion layer 38 and 39.

In addition, a first diffusion layer 38 is connected to a second transfer MOS transistor M3 through an aluminum wiring, so that in the present embodiment, the first diffusion layer 38 is controlled to have a higher concentration of n-type impurities than the second diffusion layer 39 has.

However, the concentration of the n-type impurities in the first diffusion layer 38 may be made to be equal to that in the second diffusion layer 39, or may be made to be lower than that in the second diffusion layer 39.

Channel stoppers 32a and 32b are formed at positions each adjacent to first and second diffusion layers 39 and 38 in transverse directions. The channel stoppers 32a and 32b are arranged in order to prevent a channel (N channel) from being formed between each of the diffusion layers and another element, and are insulation films such as a $SiO_2$ film, or diffusion layers with reverse conductivity to the first and second diffusion layers.

Selective oxide films 33a and 33b are respectively formed on channel stoppers 32a and 32b. The selective oxide films 33a and 33b are arranged in order to separate an additional capacitor CS from other elements, and are insulation films such as a $SiO_2$ film, for instance, formed with an LOCOS (Local Oxidation of Silicon) method.

A first dielectric film 34 is formed on a second diffusion layer 39 and a selective oxide film 33a. The first dielectric film 34 is formed by layering a $SiO_2$ film and a $SiN_2$ film. A capacitance of the first dielectric film 34 increases with the decrease of the thickness. Accordingly, the first dielectric film 34 is preferably thin within such a limit as the insulation of the first dielectric film 34 is not destroyed or deteriorated by voltage applied between a first polysilicon layer 35 formed on the first dielectric film 34 and the second diffusion layer 39. The first dielectric film 34 is preferably formed by layering the $SiO_2$ film and the $SiN_2$ film, as described in the present embodiment, because such a dielectric film 34 can minimize a current which leaks from the first dielectric film 34, but the first dielectric film 34 is not necessarily formed by layering the SiO$_2$ film and the SiN$_2$ film. For instance, the first dielectric film 34 may be formed of any one of the SiO$_2$ film and the SiN$_2$ film.

A first polysilicon layer 35 is formed on a first dielectric film 34. The first polysilicon layer 35 is connected to a power supply potential V$_{cc}$ or a ground potential GND.

Carriers having been overflown from a photodiode PD are accumulated in a capacitor composed of the first polysilicon layer 35, the second diffusion layer 39, and the first dielectric film 34 formed between them. The carriers accumulated in the capacitor move to a second transfer MOS transistor M3 through the first and second diffusion layers 38 and 39.

A second dielectric film 36 is formed on a first polysilicon layer 35. The second dielectric film 36 is also formed by layering a SiO$_2$ film and a SiN$_2$ film, as in the case of a first dielectric film 34. In addition, capacitance increases with the decrease of the film thickness, as in the case of the first dielectric film 34. Accordingly, the second dielectric film 36 is preferably thin within such a limit as the insulation of the second dielectric film 36 is not destroyed or deteriorated by voltage applied between a second polysilicon layer 37 formed on the second dielectric film 36 and the first polysilicon layer 35. Furthermore, the second dielectric film 36 may be formed of, for instance, any one of the SiO$_2$ film and the SiN$_2$ film, as in the case of the first dielectric film 34.

A second polysilicon layer 37 is formed on a second dielectric film 36. The second polysilicon layer 37 is connected to a second transfer MOS transistor M3 and a first diffusion layer 38, through a metallic wire such as an aluminum wire.

Carriers overflown from a photodiode PD are accumulated in a capacitor composed of the first polysilicon layer 35, the second polysilicon layer 37, and the second dielectric film 36 formed between them. Then, the carriers accumulated in the capacitor move to the second transfer MOS transistor M3 through the second polysilicon layer 37.

Here, the first and second polysilicon layers 35 and 37 have electroconductivity by being doped with impurities. In addition, the first and second polysilicon layers 35 and 37 are not necessarily made from polysilicon but have only to be made from a material having electroconductivity.

As described above, in the present embodiment, a first capacitor is formed of first and second diffusion layers 38 and 39 which are n-type regions, and a P well 31 which is a p-type region. In addition, a second capacitor is formed of the second diffusion layer 39, the first polysilicon layer 35 and a first dielectric film 34. Furthermore, a third capacitor is formed of the first polysilicon layer 35, the second polysilicon layer 37 and a second dielectric film 36. Thus, a solid state image pickup device in the present embodiment has the P well 31, the second diffusion layer 39, the first dielectric film 34, the first polysilicon layer 35, the second dielectric film 36 and the second polysilicon layer 37 layered in order, so as to form the first to third capacitors, and accordingly can have an additional capacitor CS formed therein while minimizing an area in a transverse direction. As a result of this, the solid state image pickup device can maximize the capacitance value of the additional capacitor CS, while minimizing the size of the additional capacitor CS. Accordingly, the solid state image pickup device can simultaneously realize the enlargement of the dynamic range and the downsizing of the pixel.

Second Embodiment

In the next place, a second embodiment according to the present invention will be described. The present embodiment differs from the first embodiment only in a connecting method of an additional capacitor CS. For this reason, the same parts as in the first embodiment are marked with the same reference numerals as those marked in FIGS. 1, 2 and 3, and the detailed description on them will be omitted.

Figure 4:
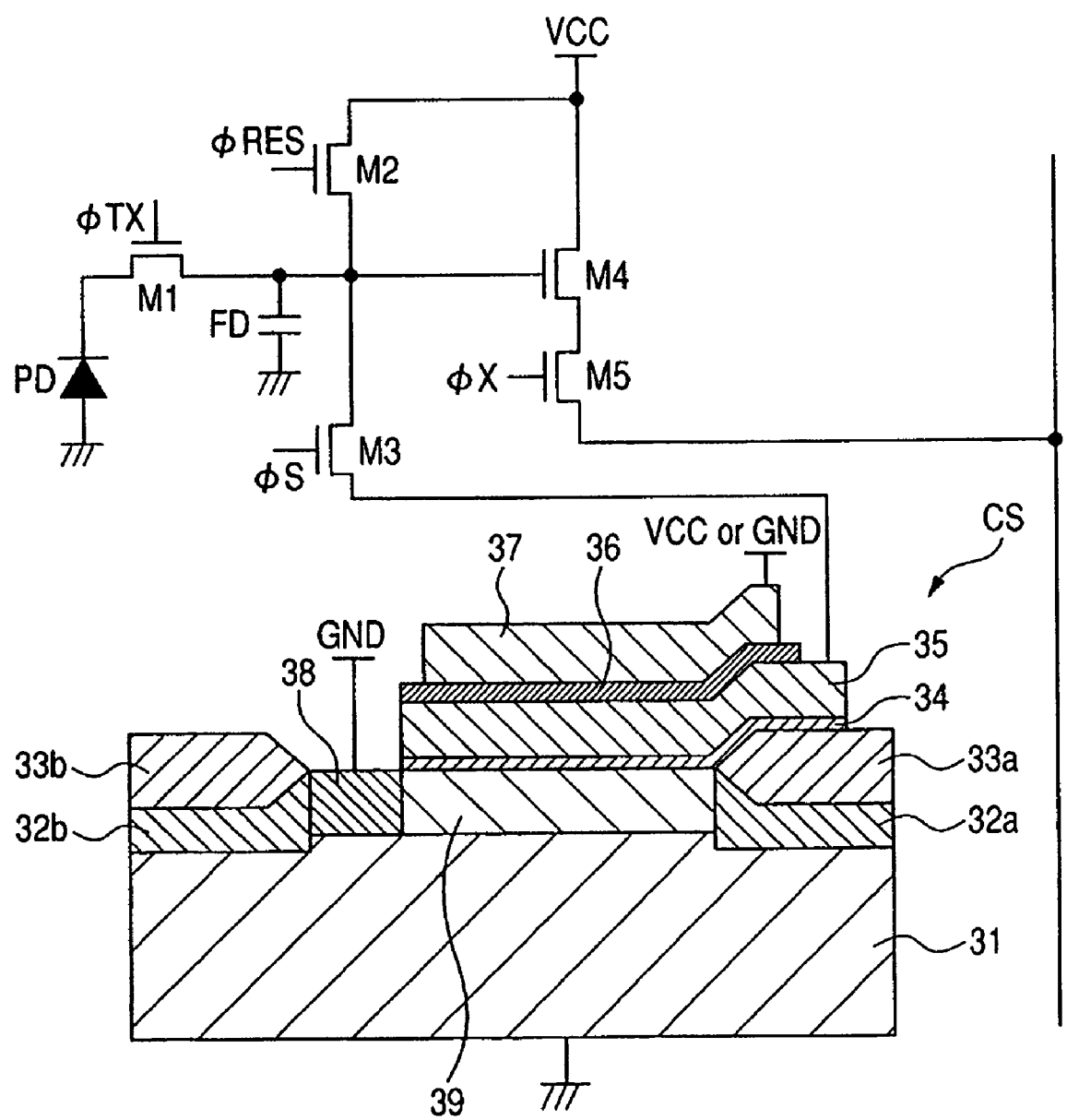
FIG. 4 is a sectional side view showing an example of the configuration of the additional capacitor, which is used in a second embodiment according to the present invention.

FIG. 4 is a sectional side view showing one example for the configuration of an additional capacitor CS in the present embodiment; and also shows a connected state of the additional capacitor CS in the pixel shown in FIG. 1.

As is shown in FIG. 4, in the present embodiment, a second diffusion layer 39 is connected to a ground potential GND, a second polysilicon layer 37 is connected to a power supply potential V$_{cc}$ or a ground potential GND, and a first polysilicon layer 35 is connected to a second transfer MOS transistor M3. Thus, the solid state image pickup device in the present embodiment sets a P well 31 and the second diffusion layer 39 to the ground potential GND (the same potential), and accordingly does not form the above described first capacitor between the first and second diffusion layers 38 and 39 which are n-type regions and the P well 31 which is a p-type region, though the solid state image pickup device in the above described first embodiment does. Accordingly, in the present embodiment, an additional capacitor CS is composed by using: a second capacitor formed of the second diffusion layer 39, the first polysilicon layer 35 and a first dielectric film 34; and a third capacitor formed of the first polysilicon layers 35, a second polysilicon layer 37, and a second dielectric film 36.

Specifically, carriers overflown from a photodiode PD are accumulated in capacitors including the first dielectric film 34 and the second dielectric film 35. Then, the carriers accumulated in the capacitors move to a second transfer MOS transistor M3 through the first polysilicon layer 35.

As has been described above, the solid state image pickup device in the present embodiment has not the above described first capacitor formed therein, and accordingly has a smaller capacitance value of an additional capacitor CS than that in the first embodiment. However, in the present embodiment, carriers originating in a leakage current generated between first and second diffusion layers 38 and 39 which are n-type regions and a P well 31 which is a p-type region are absorbed in a ground potential GND. Accordingly, the carriers originating in the leakage current is prevented from flowing into a second transfer MOS transistor M3, as much as possible. For this reason, the solid state image pickup device shows an effect of preventing noise due to the carriers originating in the leakage current from being contained in a pixel signal, as much as possible.

Third Embodiment

In the next place, a third embodiment according to the present invention will be described. The present embodiment differs from the first embodiment only in the configuration and a part of a connecting method of an additional capacitor CS. For this reason, the same parts as in the first embodiment are marked with the same reference numerals as those marked in FIGS. 1, 2 and 3, and the detailed description on them will be omitted.

Figure 5:
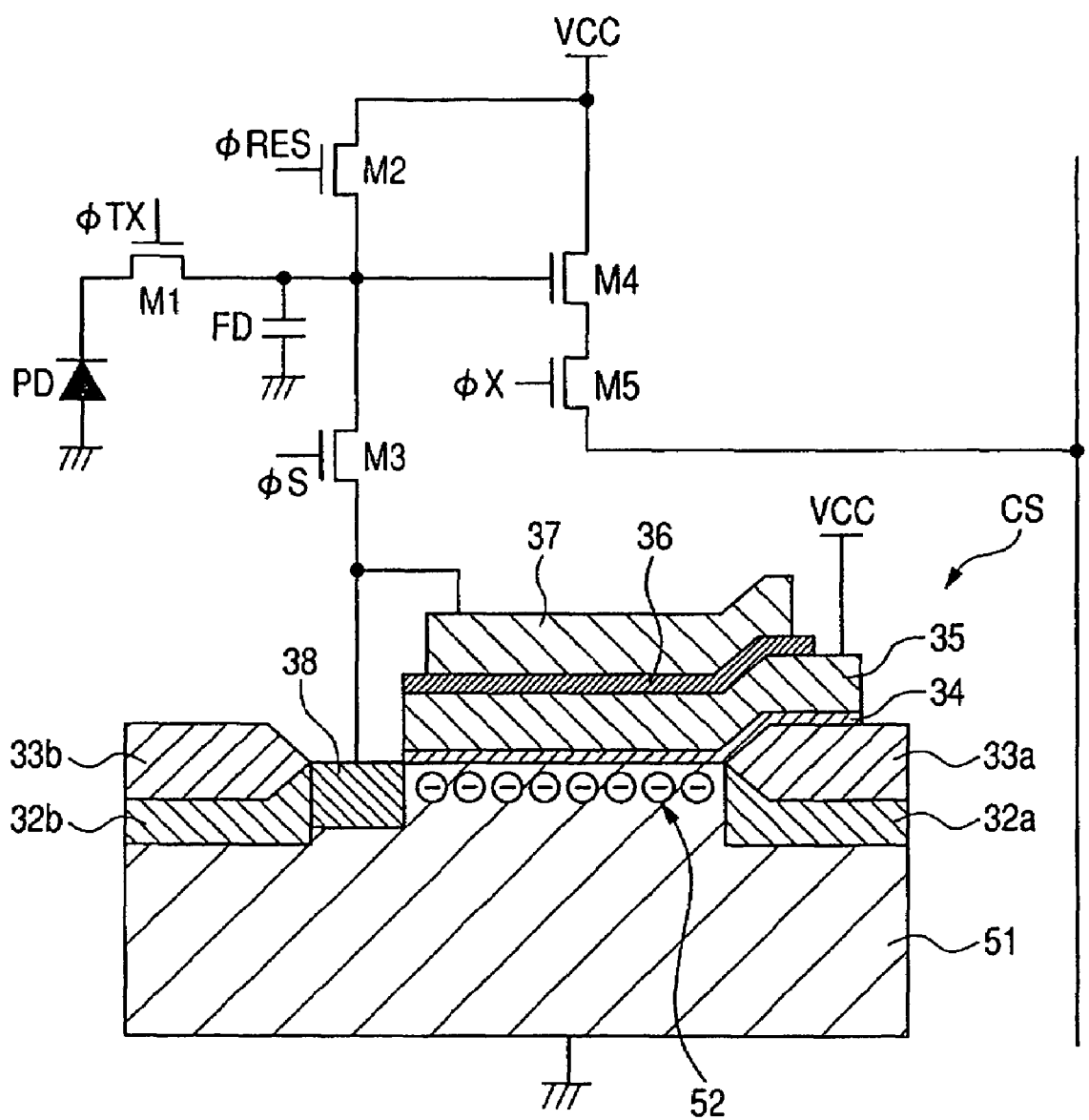
FIG. 5 is a sectional side view showing an example of the configuration of the additional capacitor, which is used in a third embodiment according to the present invention.

FIG. 5 is a sectional side view showing one example for the configuration of an additional capacitor CS in the present embodiment; and also shows a connected state of the additional capacitor CS in the pixel shown in FIG. 1.

As is shown in FIG. 5, an additional capacitor CS in the present embodiment has a configuration in which a second diffusion layer 39 is removed from a capacitor CS in the first embodiment. Though a first polysilicon layer 35 in the capacitor CS of the first embodiment is connected to a power supply potential $V_{cc}$ or a ground potential GND, the capacitor CS of the present embodiment is connected to the power supply potential $V_{cc}$.

When a first polysilicon layer 35 is thus set to a power supply potential $V_{cc}$, a substantially n-type of an inversion layer 52 is formed in the surface region of a P well 51, which contacts with a first dielectric film 34. The inversion layer 52 plays the same role as the second diffusion layer 39 in a first embodiment. Accordingly, the inversion layer 52 and the P well 51 form a capacitor similar to the above described first capacitor, though the capacitance values are different from each other.

In addition, the inversion layer 52, a first polysilicon layer 35 and a first dielectric layer 34 form a capacitor similar to the above described second capacitor, though the capacitance values are different from each other. In addition, the first polysilicon layer 35, a second polysilicon layer 37 and a second dielectric layer 36 form the above described third capacitor.

Then, carriers accumulated in the additional capacitor CS move to a second transfer MOS transistor M3, through the same path as in the case of the first embodiment.

As described above, the solid state image pickup device in the present embodiment has a configuration of forming an inversion layer 52 in the surface region of a P well 51, which contacts with a first dielectric film 34, and accordingly, can prevent the first dielectric film 34 from being oxidized (acceleratedly oxidized) by n-type impurities existing in the second diffusion layer 39, though the first dielectric film in the above described first embodiment is oxidized. Thereby, the solid state image pickup device prevents the decrease of capacitance in a capacitor formed of the inversion layer 52, the first polysilicon layer 35 and the first dielectric layer 34, as much as possible. Accordingly, the solid state image pickup device can increase the capacitance value of the capacitor formed of the inversion layer 52, the first polysilicon layer 35 and the first dielectric layer 34, in comparison with that of the above described second capacitor.

Fourth Embodiment

In the next place, a fourth embodiment according to the present invention will be described. The present embodiment differs from the third embodiment only in a part of a connecting method of an additional capacitor CS. For this reason, the same parts as in the third embodiment are marked with the same reference numerals as those marked in FIGS. 1, 2, 3 and 5, and the detailed description on them will be omitted.

Figure 6:
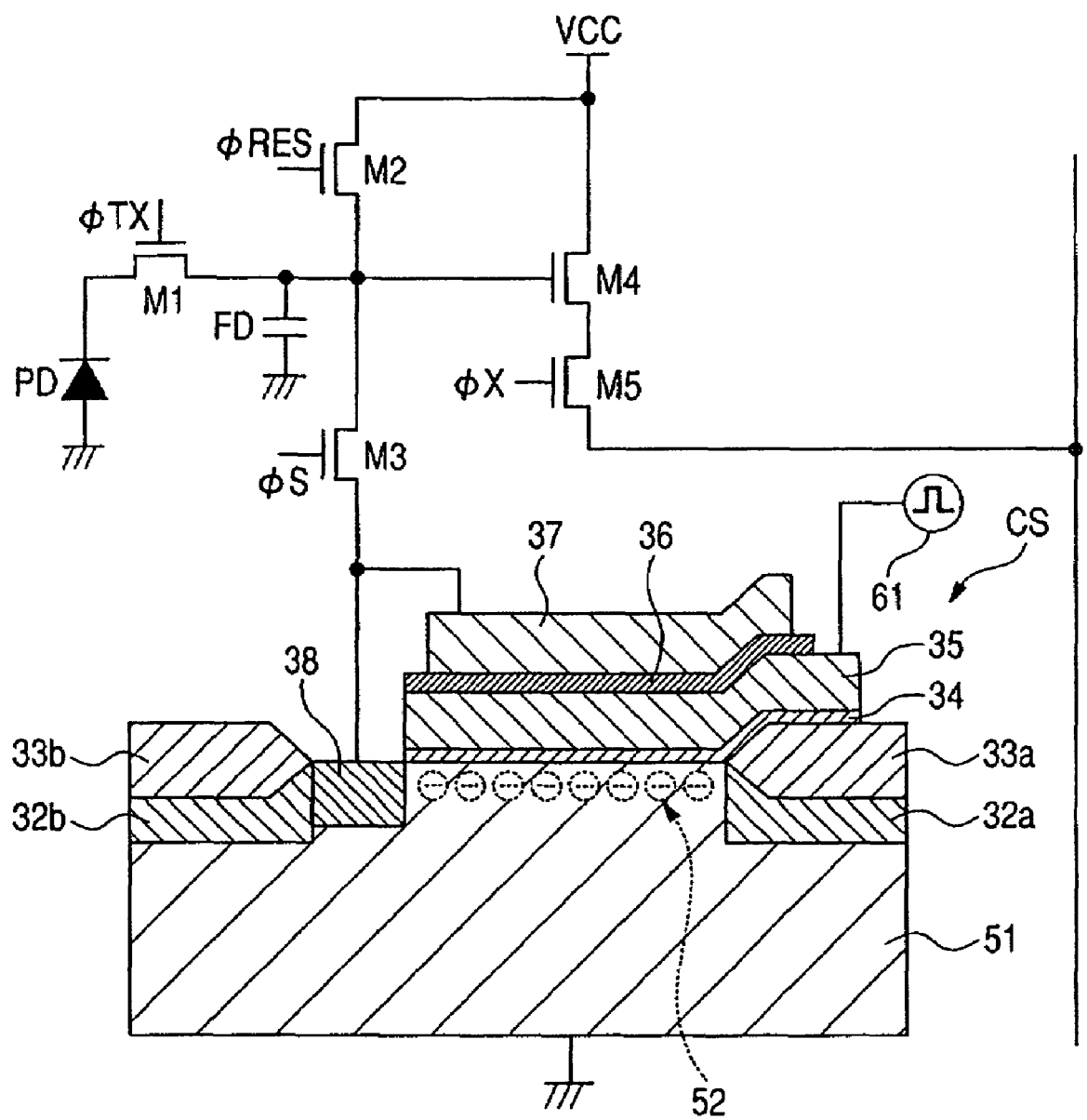
FIG. 6 is a sectional side view showing an example of the configuration of the additional capacitor, which is used in a fourth embodiment according to the present invention.

FIG. 6 is a sectional side view showing one example for the configuration of an additional capacitor CS in the present embodiment; and also shows a connected state of the additional capacitor CS in the pixel shown in FIG. 1.

As shown in FIG. 6, the solid state image pickup device in the present embodiment applies a pulse signal 61 instead of constant voltage, to a first polysilicon layer 35. A pulse signal 61 is in a low level (a ground potential GND) when a control signal φRES is in a high level in a timing chart shown in FIG. 2, and is in a high level (a power supply potential $V_{cc}$) when the control signal φRES is in a low level.

As a result of this, when a solid state image pickup device is carrying out a reset operation, a pulse signal 61 is in a low level (a ground potential GND), and an inversion layer 52 is not formed in the surface region of a P well 51, which contacts with a first dielectric film 34. Accordingly, the only above described third capacitor composed of a first polysilicon layer 35, a second polysilicon layer 37 and a second dielectric layer 36 is formed in an additional capacitor CS.

By the way, an electric charge of noise $Q_N$ [C] generated when a capacitor having a certain capacitance value C [F] is reset is expressed by the following expression (1), when k represents the Boltzmann constant and T represents the absolute temperature.

$$Q_N = (kTC)^{1/2} \quad (1)$$

In addition, noise voltage $V_N$ generated by the electric charge of noise $Q_N$ is expressed by the following expression (2).

$$V_N = ((kTC)^{1/2}/C) \quad (2)$$

Then, an electric charge of noise $Q_N$ [C] generated when an additional capacitor CS of the present embodiment is reset is expressed by the following expression (3), when $C_3$ represents a capacitance value in the above described third capacitor.

$$Q_N = (kTC_3)^{1/2} \quad (3)$$

As was described above, when a solid state image pickup device is carrying out a reset operation, a capacitance value of an additional capacitor CS in the present embodiment equals to the capacitance value $C_3$ of the third capacitor. Accordingly, when the reset operation is carried out, noise voltage $V_N$ is expressed by the following expression (4).

$$V_N = ((kTC_3)^{1/2}/C_3) = (kT/C_3)^{1/2} \quad (4)$$

On the other hand, when a reset operation is not carried out, a pulse signal 61 is set at a high level (a power supply potential $V_{cc}$), and an inversion layer 52 is formed in the surface region of a P well 51, which contacts with a first dielectric film 34. Accordingly, as in the case of the third embodiment, an additional capacitor CS consists of a capacitor (having the capacitance value of $C_1$) formed of the inversion layer 52 and the P well 51, a capacitor (having the capacitance value of $C_2$) formed of the inversion layer 52, the first polysilicon layer 35 and the first dielectric layer 34, and the above described third capacitor, which are all connected in parallel.

Then, a capacitance value of an additional capacitor CS in the present embodiment is the total value of the capacitance values $C_1$, $C_2$ and $C_3$, when a reset operation is not carried out. Accordingly, when the reset operation is not carried out, noise voltage $V_N$ is expressed by the following expression (5).

$$V_N = ((kTC_3)^{1/2}/C_1 + C_2 + C_3) \quad (5)$$

Therefore, even when a reset operation is carried out, the value of the numerator of the right side member in the above described expression (5) is smaller than the value $(=(kT(C_1 + C_2 + C_3)^{1/2})$ when a high level of a signal (a power supply potential $V_{cc}$) is applied. Specifically, a solid state image pickup device generates a lower noise voltage $V_N$ in the case of having continuously applied the high level of a signal (a power supply potential $V_{cc}$) to the first polysilicon layer 35, than that in the case of having applied the pulse signal 61.

As has been described above, the solid state image pickup device in the present embodiment applies a low-level of a pulse signal 61 to a first polysilicon layer 35, when carrying out a reset operation, so as not to form an inversion layer 52 in the surface region of a P well 51, which contacts with a first dielectric film 34. On the other hand, the solid state image pickup device applies a high level of a pulse signal 61 to the first polysilicon layer 35, when carrying out no reset operation, to form the inversion layer 52 in the surface region of the P well 51, which contacts with the first dielectric film 34. Thereby, the solid state image pickup device controls a capacitance value of an additional capacitor CS to only the capacitance value $C_3$ of the third capacitor, when carrying out a reset operation, and can decrease reset noise.

Fifth Embodiment

In the next place, a fifth embodiment according to the present invention will be described. The present embodiment differs from the fourth embodiment only in the position of a photodiode PD with respect to an additional capacitor CS. For this reason, the same parts as in the fourth embodiment are marked with the same reference numerals as those marked in FIGS. 1, 2, 3 and 6, and the detailed description on them will be omitted.

Figure 7:
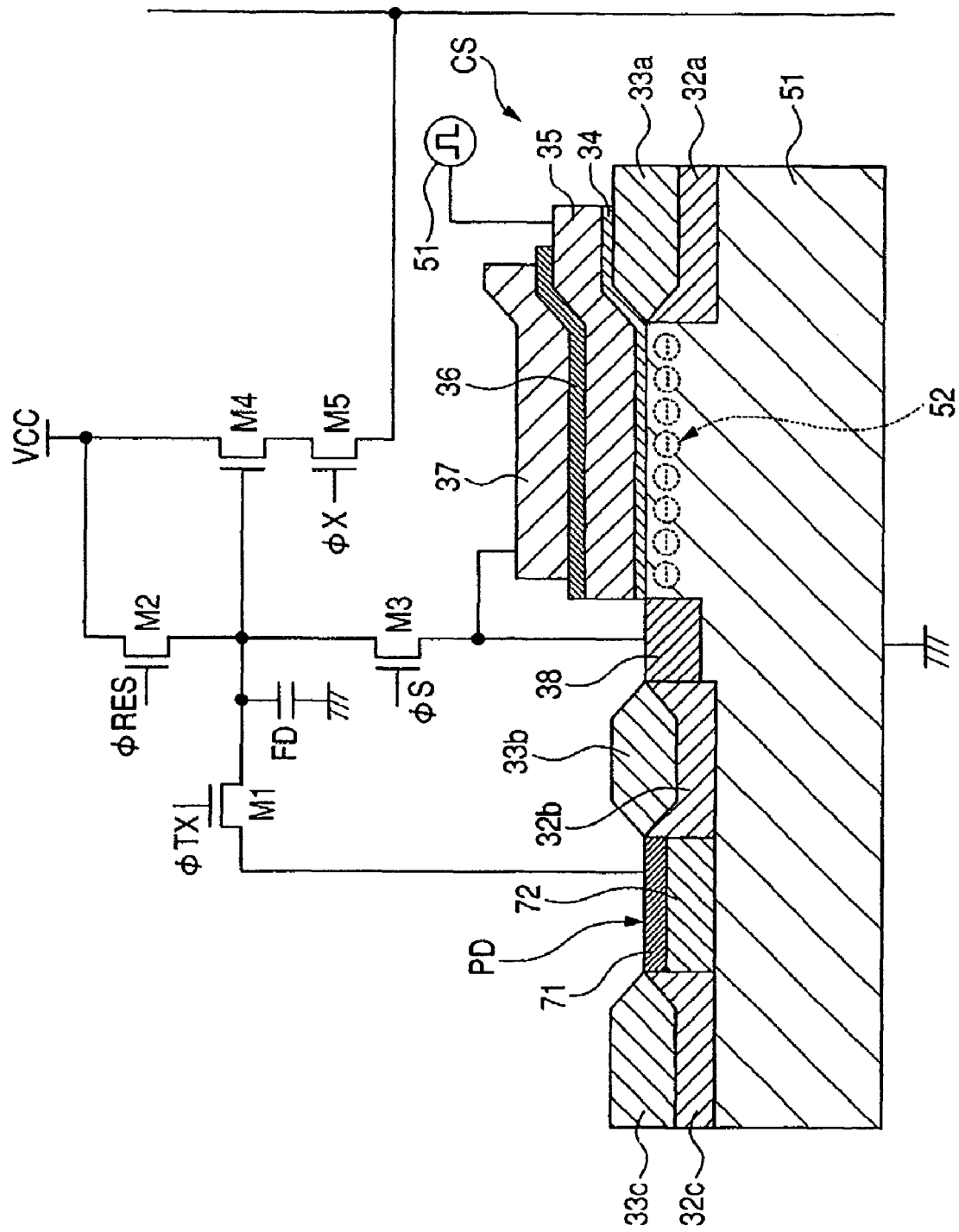
FIG. 7 is a sectional side view showing an example of the configuration of the additional capacitor, which is used in a fifth embodiment according to the present invention.

FIG. 7 is a sectional side view showing one example for the configuration of an additional capacitor CS in the present embodiment; and also shows a connected state of the additional capacitor CS in the pixel shown in FIG. 1.

In FIG. 7, an n-type semiconductor film 72 containing n-type impurities is formed on the surface side of a P well 51. On the n-type semiconductor film 72, a p-type semiconductor layer 71 is formed which is a shielding layer for making a photodiode PD as an embedded structure. As described above, in the present embodiment, the photodiode PD composed of the n-type semiconductor film 72 and a P well 51 has the embedded structure. In addition, a selective oxide film 33c is arranged so as to separate the photodiode PD from other devices except the additional capacitor CS, and a channel stopper 32c is arranged so as to prevent a channel from being formed between the photodiode PD and other devices except the additional capacitor CS.

In the present embodiment, thus composed photodiode PD and a first diffusion layer 38 are arranged so as to face each other through a selective oxide film 33b and a channel stopper layer 32b, and form an additional capacitor CS and a photodiode PD. (Specifically, they are arranged so that a distance between the photodiode PD and the additional capacitor CS is shortest out of distances between the photodiode PD and any of its surrounding devices).

As has been described above, the solid state image pickup device in the present embodiment has a photodiode PD and a first diffusion layer 38 arranged so as to face each other through a selective oxide film 33b and a channel stopper layer 32b, and makes a potential barrier between the photodiode PD and an additional capacitor CS smallest of potential barriers between the photodiode PD and any of its surrounding devices. Thereby, the solid state image pickup device can make carriers overflown from the photodiode PD accumulated in the additional capacitor CS with as high efficiency as possible. Thereby, the solid state image pickup device can further enlarge the dynamic range.

The solid state image pickup device in the present embodiment has a photodiode PD and a first diffusion layer 38 arranged so as to face each other through a selective oxide film 33b and a channel stopper layer 32b, but is not always necessary to have such a configuration as long as it makes a potential barrier between the photodiode PD and an additional capacitor CS smallest of potential barriers between the photodiode PD and any of the surrounding devices.

Specifically, a photodiode PD and an additional capacitor CS are not necessarily arranged so that a distance between them can be shortest, as long as they are arranged so that a potential barrier between them can be smallest. For instance, the photodiode PD and the additional capacitor CS may be arranged so that the potential barrier between them can be smallest, by omitting the formation of at least any one of a channel stopper 32b and a selective oxide film 33b. In this case, a distance between the photodiode PD and the additional capacitor CS may be longer than a distance between the photodiode PD and another device.

In addition, in the present embodiment, an additional capacitor CS shown in the fourth embodiment was described as an example, but it goes without saying that an additional capacitor CS shown in the first or third embodiment may be employed.

Sixth Embodiment

In the next place, a sixth embodiment according to the present invention will be described. The present embodiment differs from the first embodiment only in a wiring method for an additional capacitor CS and a second transfer MOS transistor M3. For this reason, the same parts as in the first embodiment are marked with the same reference numerals as those marked in FIGS. 1, 2 and 3, and the detailed description on them will be omitted.

Figure 8A:
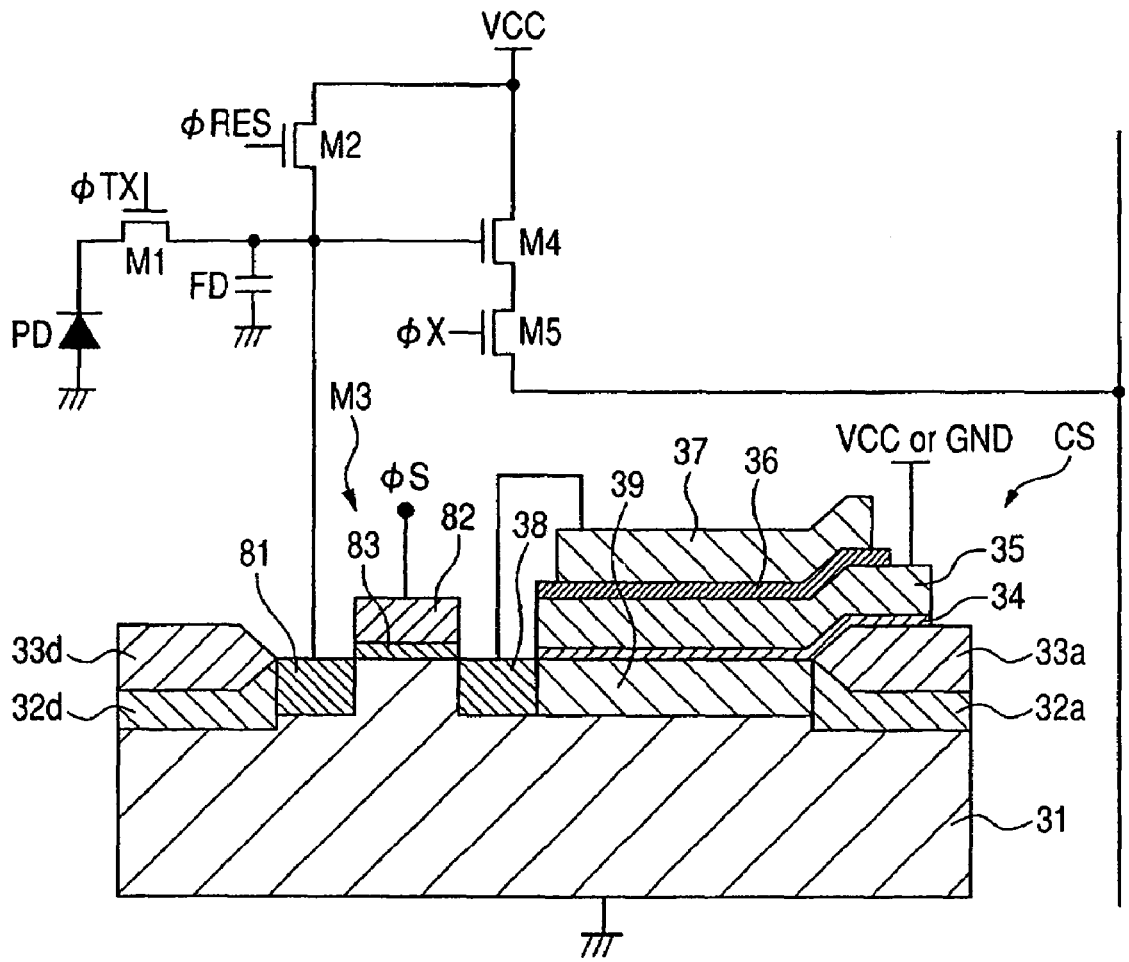
FIGS. 8A and 8B are views showing examples of the configuration of an additional capacitor and a second transfer MOS transistor, which is used in a sixth embodiment according to the present invention.
Figure 8B:
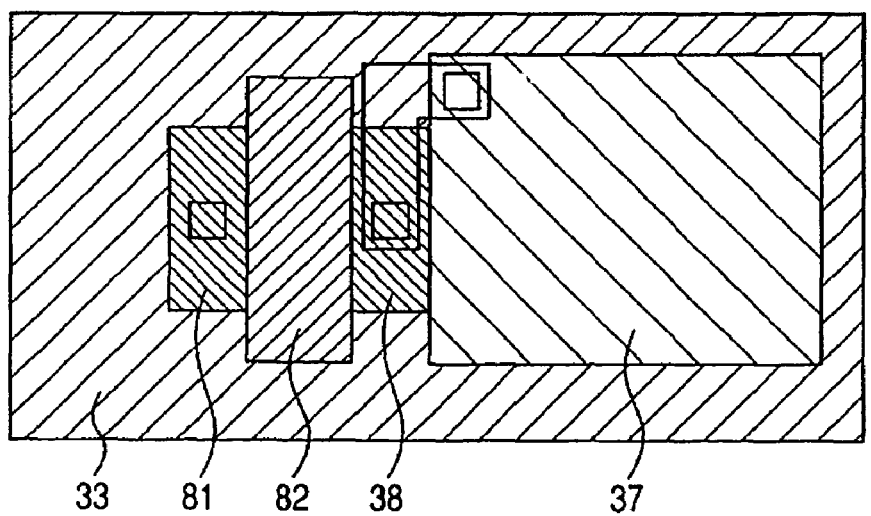

FIGS. 8A and 8B are views showing an example of the configuration of an additional capacitor CS and a second transfer MOS transistor M3 in the present embodiment. FIG. 8A is a sectional side view showing an example of a diagrammatic configuration of the additional capacitor CS and the transfer MOS transistor M3. FIG. 8B is a plan view showing an example of a diagrammatic configuration of the additional capacitor CS and the transfer MOS transistor M3.

In FIGS. 8A and 8B, the second transfer MOS transistor M3 has a P well 31, a gate insulation film 83, a gate electrode 82, a first diffusion layer 38 and a third diffusion layer 81.

A third diffusion layer 81 is formed by doping (adding) n-type impurities into the surface region of a P well 31.

A gate insulation film 83 is formed on a region of the P well 31, which is sandwiched by a first diffusion layer 38 and the third diffusion layer 81. The gate insulation film 83 is formed by layering a $SiO_2$ film and a $SiN_2$ film. However, the gate insulation film 83 is not necessarily formed by layering the $SiO_2$ film and the $SiN_2$ film as long as it is an insulation film, but may be formed of, for instance, any one of the $SiO_2$ film and the $SiN_2$ film.

A gate electrode 82 is a metallic layer or a polysilicon layer formed on a gate oxide film 83, and a control signal φS is input therein.

As described above, the source region and the drain region of a second MOS transistor M3 of the present embodiment are formed of the first diffusion layer 38 and the third diffusion layer 81. Accordingly, an additional capacitor CS and the second MOS transistor M3 share the first diffusion layer 38.

A channel stopper 32d is formed at a position adjacent to a third diffusion layer 81, in order to prevent a channel from being formed between a second MOS transistor M3 and another device except an additional capacitor CS. A selective oxide film 33d is formed on the channel stopper 32d in order to separate a second MOS transistor M3 from another device except an additional capacitor CS.

Figure 9A:
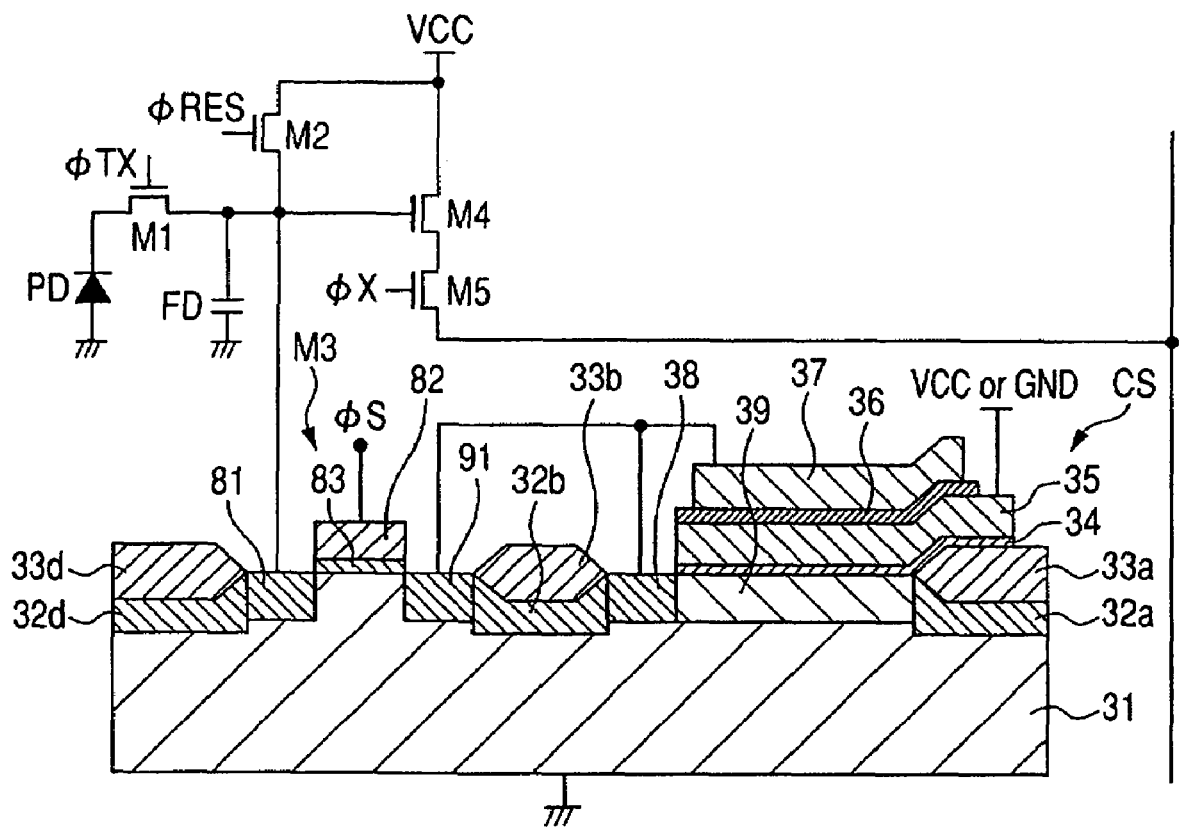
FIGS. 9A and 9B are views showing examples of the configuration of an additional capacitor and a second transfer MOS transistor, which is used in a first embodiment according to the present invention.
Figure 9B:
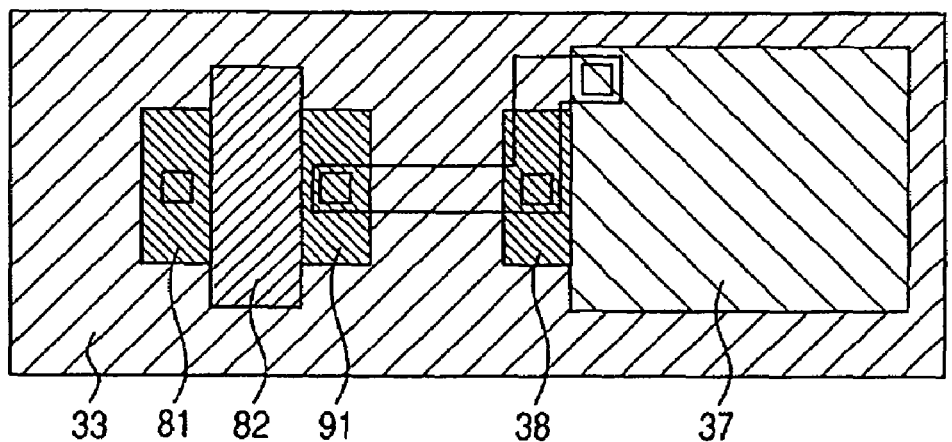

FIGS. 9A and 9B are views showing one example of the configuration of an additional capacitor CS and a second transfer MOS transistor M3, in the above described first embodiment. FIG. 9A is a sectional side view showing an example of a diagrammatic configuration of the additional capacitor CS and the second transfer MOS transistor M3, which has been described in the first embodiment. FIG. 9B is a plan view showing an example of a diagrammatic configuration of the additional capacitor CS and the second transfer MOS transistor M3, which has been described in the first embodiment. In FIGS. 9A and 9B, the same parts as in FIGS. 3, 8A and 8B are marked with the same reference numerals as those marked in FIGS. 8A and 8B.

In FIGS. 9A and 9B, a second transfer MOS transistor M3 has a P well 31, a gate insulation film 83, a gate electrode 82, a third diffusion layer 81 and a fourth diffusion layer 91.

A fourth diffusion layer 91 is formed by doping (adding) n-type impurities into the surface region of a P well 31.

A gate insulation film 83 is formed on the region of the P well 31, which is sandwiched by the third diffusion layer 81 and the fourth diffusion layer 91.

A gate electrode 82 is a metallic layer or a polysilicon layer formed on a gate oxide film 83, and a control signal φS is input therein.

In addition, as has been described in the first embodiment, a channel stopper 32b prevents a channel from being formed between an additional capacitor CS and the second MOS transistor M3, and a selective oxide film 33b separates the additional capacitor CS from the second MOS transistor M3.

In addition, as described above, the channel stopper 32d prevents the channel from being formed between the second MOS transistor M3 and another device except the additional capacitor CS. A selective oxide film 33d separates the second MOS transistor M3 from another device except the additional capacitor CS.

As shown in FIGS. 9A and 9B, in the first embodiment, a first diffusion layer 38, a second polysilicon layer 37 and a fourth diffusion layer 91 are interconnected with the use of a metallic wire such as an aluminum wire.

In contrast to this, in the present embodiment, an additional capacitor CS and a second MOS transistor M3 share the first diffusion layer 38 as shown in FIGS. 8A and 8B; and one electrode of the additional capacitor CS and one electrode of the second MOS transistor M3 are connected in the active region (that is a region in which a device is formed) of a P well 31. Thereby, the solid state image pickup device needs not forming an element-separating region including a selective oxide film 33b and a channel stopper 32b therein; can also decrease the number of wires therein; and accordingly, further downsize the pixel.

In the present embodiment a capacitor CS shown in the first embodiment is used as an example, but it goes without saying that a capacitors CS shown in the third embodiment or the fourth embodiment may be used.

Other Embodiments

Figure 10:
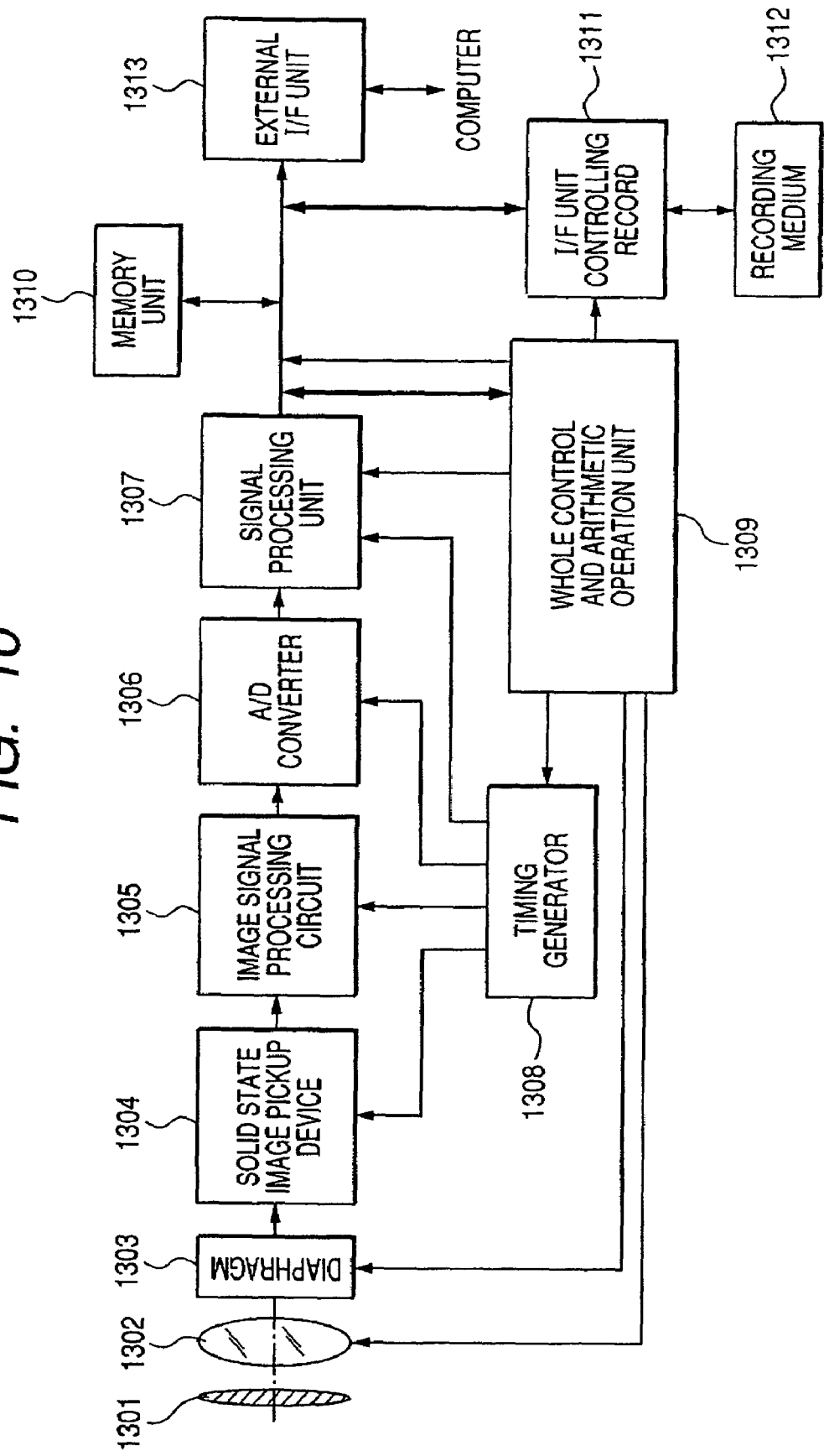
FIG. 10 is a block diagram showing an example of the configuration of a still video camera, which is used in another embodiment according to the present invention.

One embodiment of having applied the solid state image pickup device in each of the above described embodiments to a still camera will be now described in detail, with reference to FIG. 10.

FIG. 10 is a block diagram showing an operation of the "still video camera" which has employed the solid state image pickup device in each of the above embodiments.

In FIG. 10, reference numeral 1301 is a barrier serving as a protection for a lens and a main switch; reference numeral 1302 is the lens for focuses an optical image of a photogenic subject on a solid-state image sensing device 1304; reference numeral 1303 is a diaphragm for varying a quantity of light passing through the lens 1302; reference numeral 1304 is the solid-state image sensing device for capturing the photogenic subject focused by the lens 1302, as a picture signal; and reference numeral 1306 is an A/D converter for converting analog data of picture signals output from the solid-state image sensing device 1304 to digital data.

Reference numeral 1307 is a signal processing unit for variously correcting image data output from an A/D converter 1306 and compressing data; reference numeral 1308 is a timing generator for outputting various timing signals to a solid-state image sensing device 1304, an image signal processing circuit 1305, the A/D converter 1306 and a signal processing unit 1307; reference numeral 1309 is a whole control and arithmetic operation unit for controlling various computations and the whole still video camera; reference numeral 1310 is a memory unit for temporarily memorizing the image data; reference numeral 1311 is an interfacing part for recording on or reading out from a recording medium; reference numeral 1312 is a removable recording medium such as a semiconductor memory for recording or reading out the image data; and reference numeral 1313 is an interfacing part for communicating with an external computer or the like.

In the next place, an operation for photographing while using a still video camera having the above described configuration will be described.

When a barrier 1301 is opened, a main power source is turned on, subsequently the power source of a control system is turned on, and the power source of an image-pickup-system circuit such as an A/D converter 1306 is further turned on.

Then, in order to control light exposure, a whole control and arithmetic operation unit 1309 opens a diaphragm 1303 into a full aperture, and an A/D converter 1306 converts a signal output from a solid-state image sensing device 1304 to digital data and inputs it into a signal processing unit 1307.

The whole control and arithmetic operation unit 1309 computes the amount of exposure on the basis of the data; judges brightness from a result of the photometry; and controls the diaphragm in response to the result.

A whole control and arithmetic operation unit 1309 takes out a high-frequency component on the basis of a signal output from a solid-state image sensing device 1304; computes a distance reaching to a photogenic subject; then, drives a lens; judges whether the focus is achieved or not; when having judged that the focus is not achieved, drives the lens again to measure the distance; and when having confirmed that the focus is achieved, starts real exposure.

After the exposure has been finished, the solid-state image sensing device 1304 outputs a picture signal to an A/D converter 1306; the A/D converter 1306 converts it to a digital signal; and the whole control and arithmetic operation unit 1309 writes the digital signal having passed through a signal processing unit 1307 in a memory unit.

Afterwards, the whole control and arithmetic operation unit 1309 controls and records the data accumulated in the memory unit 1310 in a removable recording medium 1312 such as a semiconductor memory, through a recording medium control I/F part. Alternatively, the data may be directly input to a computer through an external I/F unit 1313, and the image may be processed.

In the next place, one embodiment of having applied the solid state image pickup device in each of the above described embodiments to a video camera will be described in detail, with reference to FIG. 11.

Figure 11:
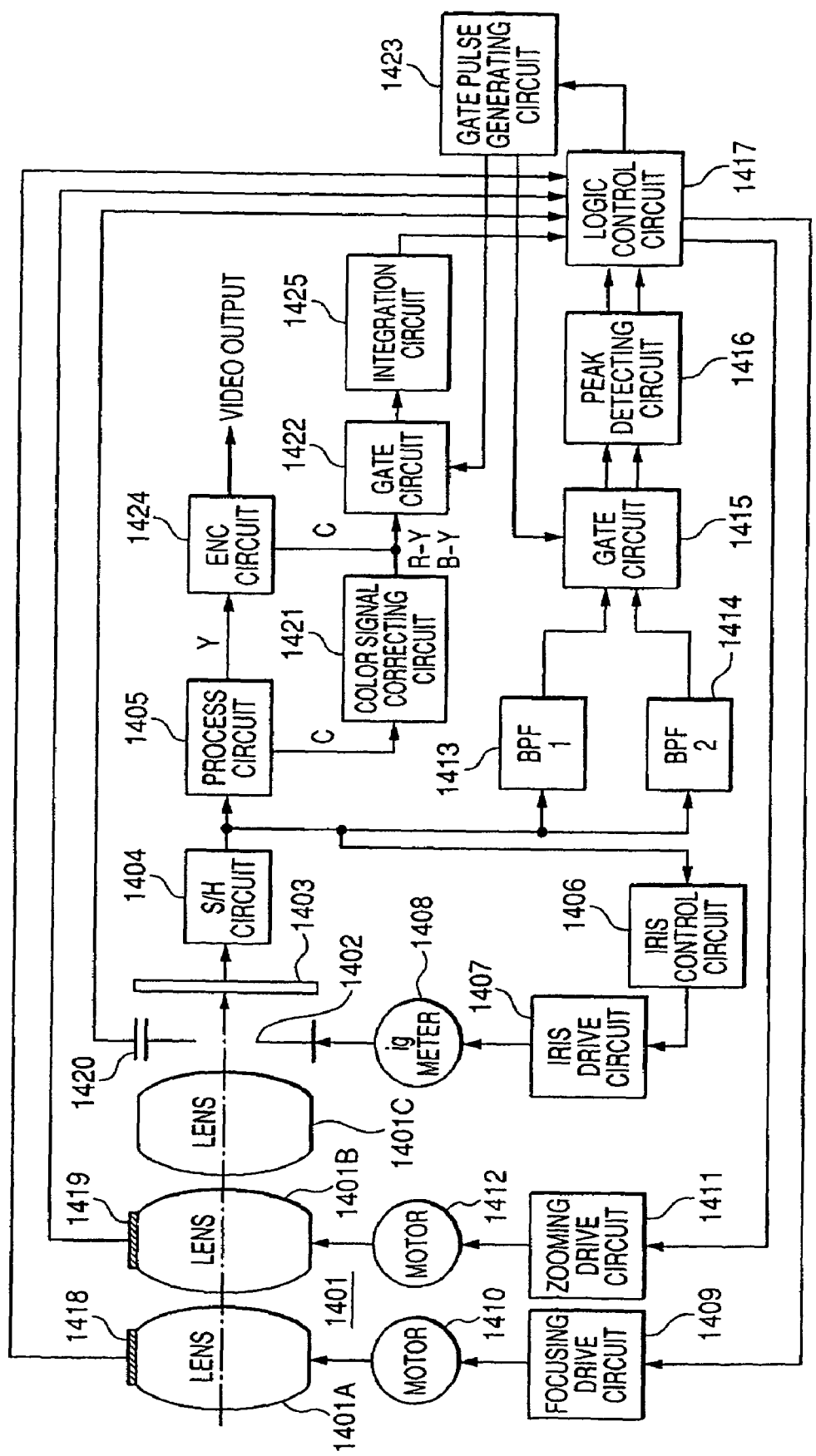
FIG. 11 is a block diagram showing an example of a configuration of a video camera, which is used in another embodiment according to the present invention.

FIG. 11 is a block diagram showing an operation of the "video camera" which has employed the solid state image pickup device of each of the above described embodiments. In FIG. 11, reference numeral 1401 is taking lens consisting of a focus lens 1401A for adjusting focus, a zoom lens 1401B for zooming, and a lens 1401C for focusing.

Reference numeral 1402 is a diaphragm; reference numeral 1403 is a solid-state image sensing device for photoelectrically converting a photogenic subject image focused on an image-pickup surface to an electric imaging signal; and reference numeral 1404 is a sample-holding circuit (S/H circuit) which sample-holds the imaging signal output from the solid-state image sensing device 3, amplifies the level, and outputs the picture signal.

Reference numeral 1405 is a process circuit which performs predetermined processing, such as gamma correction, color separation and blanking, on a picture signal output from a sample-holding circuit 1404, and outputs a luminance signal Y and a chroma signal C. A color signal correcting circuit 1421 corrects a white balance and a color balance of the chroma signal C output from the process circuit 1405, and outputs the corrected signals as color-difference signals R–Y and B–Y.

Then, an encoder circuit (ENC circuit) 1424 modulates a luminance signal Y output from a process circuit 1405 and color-difference signals R–Y and B–Y output from a color signal correcting circuit 1421, and outputs the modulated signals as normal television signals. Then, the modulated signals are supplied to a video recorder or an electronic view finder such as a monitor EVF (Electric View Finder), which are not shown in the figure.

Reference numeral 1406 is an iris control circuit which controls an iris drive circuit 1407 on the basis of a picture signal supplied from the sample-holding circuit 1404, and automatically controls an ig meter so as to control an aperture degree of a diaphragm 1402, so that a level of the picture signal can be kept constant at a predetermined level.

Reference numerals 1413 and 1414 are bandpass filters (BPF) which have different band limits, and extract a high-frequency component necessary for detecting whether focusing is achieved or not, from picture signals output from a sample-holding circuit 1404. A gate circuit 1415 and a focus gate frame signal gate and receive each signal output from the first bandpass filter 1413 (BPF1) and the second bandpass filter 1414 (BPF2); a peak detecting circuit 1416 detects each peak value and holds them; and a logic control circuit 1417 receives the values.

The signal is called focus voltage which decides focusing.

Reference numeral 1418 is a focus encoder for detecting a position of a moving focus lens 1401A; reference numeral 1419 is a zoom encoder for detecting a focal length of a zoom lens 1401B; and reference numeral 1420 is an iris encoder for detecting an aperture degree of a diaphragm 1402. A logic control circuit 1417 for controlling the system receives these detected values in the encoders; detects focusing for a photogenic subject on the basis of a picture signal in a set region to be focus-detected; and adjusts the focus. Specifically, the logic control circuit 1417 takes in a peak information of a high-frequency component supplied from each bandpass filter 1413 and 1414; supplies a control signal such as the rotational direction, rotational speed and rotation/stopping of a focus motor 1410 to a focusing drive circuit 1409 so as to drive the focus lens 1401A to such a position as the peak value of the high-frequency component can be maximized; and controls the focus motor.

Any of the above described embodiments is nothing but a specific example for realizing the present invention, so that a technical scope of the present invention must not be interpreted within a limit because of the embodiments.

This application claims priority from Japanese Patent Application No. 2005-080081 filed Mar. 18, 2005, which is hereby incorporated by reference herein.

What is claimed is:

1. A solid state image pickup device including a plurality of pixels, the device comprising:
    a photoelectric conversion region for accumulating carriers generated by incident light;
    a first transfer switch for transferring the carriers accumulated in the photoelectric conversion region;
    a floating diffusion region for making the carriers accumulated in the photoelectric conversion region flow therein through the first transfer switch;
    a carrier accumulating region for accumulating at least a part of carriers overflowed from the photoelectric conversion region; and
    a second transfer switch for transferring the carriers accumulated in the carrier accumulating region to the floating diffusion region;
    wherein the carrier accumulating region includes:
        one part of a semiconductor region of a first conductivity type,
        a first dielectric film formed on the one part of the semiconductor region,
        a first electrode layer formed on the first dielectric film,
        a second dielectric film formed on the first electrode layer,
        a second electrode layer formed on the second dielectric film,
        a first impurity-diffused layer which is formed in the semiconductor region so as to be vertically adjacent to the first dielectric film and contains impurities of a second conductivity type opposite to the first conductivity type, and
        a second impurity-diffused layer which is formed in the semiconductor region so as to be horizontally adjacent to the first impurity-diffused layer, and contains the impurities of the second conductivity type.

2. The solid state image pickup device according to claim 1, wherein
    the first electrode layer is connected to a power supply potential or a ground potential, and
    the second impurity-diffused layer, the second electrode layer and the second transfer switch are interconnected.

3. The solid state image pickup device according to claim 1, wherein
    the second electrode layer is connected to a power supply potential or a ground potential,
    the first electrode layer and the second transfer switch are interconnected, and
    the second impurity-diffused layer is connected to the ground potential.

4. The solid state image pickup device according to claim 2, wherein the second transfer switch includes:
    one part of the semiconductor region, an insulation film formed on the surface of the semiconductor region,
    the second impurity-diffused layer,
    a third impurity-diffused layer which is formed at a position facing the second impurity-diffused layer through a lower region of the insulation film and contains the impurities of the second conductivity type, and
    an electrode layer formed on the insulation film.

* * * * *